United States Patent
Coglitore et al.

(10) Patent No.: US 6,496,366 B1
(45) Date of Patent: Dec. 17, 2002

(54) HIGH DENSITY COMPUTER EQUIPMENT STORAGE SYSTEM

(75) Inventors: Giovanni Coglitore, Los Gatos, CA (US); Nikolai Gallo, Menlo Park, CA (US); Jack Randall, Ben Lomond, CA (US)

(73) Assignee: Rackable Systems, LLC, San Jose, CA (US)

(*) Notice: Subject to any disclaimer, the term of this patent is extended or adjusted under 35 U.S.C. 154(b) by 0 days.

(21) Appl. No.: 09/479,824

(22) Filed: Jan. 7, 2000

Related U.S. Application Data
(60) Provisional application No. 60/161,578, filed on Oct. 26, 1999.

(51) Int. Cl.[7] .................. G06F 1/20; H05K 7/20
(52) U.S. Cl. ............... 361/687; 361/724; 361/695; 174/35 R; 174/35 GC
(58) Field of Search .................. 361/687, 683, 361/724–727, 715, 716, 695, 678, 697, 816; 174/35 R, 35 GC

(56) References Cited

U.S. PATENT DOCUMENTS

| | | | | |
|---|---|---|---|---|
| 1,853,428 A | * | 4/1932 | Jackson | 361/678 |
| 4,644,443 A | * | 2/1987 | Swensen et al. | 361/687 |
| 4,691,274 A | * | 9/1987 | Matouk et al. | 361/678 |
| 4,702,154 A | | 10/1987 | Dodson | |
| 4,728,160 A | | 3/1988 | Mondor et al. | |
| 4,774,631 A | * | 9/1988 | Okuyama et al. | 361/687 |
| 4,860,163 A | * | 8/1989 | Sarath | 361/687 |
| 4,901,200 A | | 2/1990 | Mazura | |
| 5,136,464 A | | 8/1992 | Ohmori | |
| 5,398,159 A | | 3/1995 | Andersson et al. | |
| 5,432,674 A | | 7/1995 | Hardt | |
| 5,460,441 A | | 10/1995 | Hastings et al. | |
| 5,505,533 A | * | 4/1996 | Kammersqard et al. | 312/236 |
| 5,515,239 A | | 5/1996 | Kamerman et al. | |
| 5,528,454 A | | 6/1996 | Niklos | |
| 5,587,877 A | | 12/1996 | Ryan et al. | |

(List continued on next page.)

FOREIGN PATENT DOCUMENTS

| | | | | |
|---|---|---|---|---|
| FR | 2 610 471 A1 | * | 5/1988 | H05K/5/04 |

OTHER PUBLICATIONS

Anonymous, "Cobalt RaQ 2," at<http://www.cobalt.com/products/pdfs/datasheet.raq2.pdf> (visited on Nov. 27, 2000) 2 pages.

(List continued on next page.)

*Primary Examiner*—Darren Schuberg
*Assistant Examiner*—Lisa Lea-Edmonds
(74) *Attorney, Agent, or Firm*—Morrison & Foerster LLP

(57) ABSTRACT

This involves the efficient placement of multiple computers within a given site. The available density of computer systems that may be provided at a location is advantageously increased through various features. By placement of access space to all elements which require periodic attention at the front of each computer, the need for significant space at the rear of a computer is eliminated. Such a computer hardware configuration facilitates back-to-back placement of computers in a rack. Racks filled in this manner may be arranged in rows or otherwise. The back-to-back computers in a rack define an air/gas column that may be air conditioned. By drawing air from this column (or forcing it) through a computer from its back/sides to its front/sides across heat-generating components, highly-effective cooling with certain advantages is achieved. Alternately, by drawing air from the environment in which the computers are placed and passing it through the front/sides to the back/sides of the computer across heat-generating components, highly-effective cooling associated with other advantages may be achieved.

47 Claims, 9 Drawing Sheets

U.S. PATENT DOCUMENTS

| | | | |
|---|---|---|---|
| 5,602,721 A | | 2/1997 | Slade et al. |
| 5,691,883 A | | 11/1997 | Nelson |
| 5,793,608 A | * | 8/1998 | Winick et al. ............... 361/695 |
| 5,796,580 A | * | 8/1998 | Komatsu et al. ............ 361/687 |
| 5,813,243 A | | 9/1998 | Johnson et al. |
| 5,822,182 A | * | 10/1998 | Scholder et al. ............ 361/683 |
| 5,896,273 A | | 4/1999 | Varghese et al. |
| 5,909,357 A | | 6/1999 | Orr |
| 5,947,570 A | | 9/1999 | Anderson et al. |
| 5,956,227 A | | 9/1999 | Kitaoka |
| 6,000,464 A | * | 12/1999 | Scafidi et al. ............... 361/724 |
| 6,088,224 A | * | 7/2000 | Gallagher et al. .......... 361/695 |
| 6,098,131 A | * | 8/2000 | Unger et al. ................ 361/687 |
| 6,134,667 A | * | 10/2000 | Suzuki et al. ............... 361/687 |
| 6,141,213 A | * | 10/2000 | Antonuccio et al. ........ 361/687 |
| 6,147,862 A | * | 11/2000 | Ho ............................. 361/685 |
| 6,259,605 B1 | * | 7/2001 | Schmitt ...................... 361/727 |

OTHER PUBLICATIONS

Anonymous, "Cobalt RaQ 3," at<http://www.cobalt.com/products/pdfs/datasheet.raq3.pdf> (visited on Nov. 27, 2000), 2 pages.

Anonymous, "Cobalt RaO 4," at <http://www.cobalt.com/products/pdfs/datasheet.raq4.pdf> (visited on Nov. 27, 2000), 2 pages.*

Anonymous, "SGI —O2 Workstation Product Overview," at<http://www.sgi.com/o2/overview.html> (visited on Sep. 8, 2000), 4 pages.*

Anonymous. (Mar. 10, 1988). "Silicon Graphics Unveils Dedicated, Entry–Level Hosting Solution," Press Release at <http://www.sgi.com/newsroom/press_releases/1998/march/o2webserver_release.html> (visited on Jan. 6, 2000), 2 pages.*

Anonymous. "A Rack–Mountable Web Server for ISPs of All Sizes," at <http://www.sgi.com/solutions/internet/products/rackmount.html> (visited on Jan. 6, 2000), 4 pages.*

Anonymous. (Monday , Apr. 24, 2000). "Rackmount Solutions," *San Jose Mercury News* Business Section, 1 Page.*

* cited by examiner

HIGH DENSITY COMPUTER EQUIPMENT STORAGE SYSTEM

CROSS-REFERENCE TO RELATED APPLICATION

This application claims priority to provisional patent application Ser. No. 60/161,578 filed Oct. 26, 1999, which is incorporated by reference herein in its entirety.

FIELD OF THE INVENTION

This relates to the manner in which computers are configured and provided in a given area in order to conserve space and deal with cooling issues associated with housing a large number of computers. Aspects of the invention assist with increasing the density at which computers may be provided, particularly in a network server or host environment.

BACKGROUND OF THE INVENTION

Many computers today are assembled from components built to one or more industry standards. The use of standardized components using specific interfaces allows for ease of supply, efficiency in production, and competitiveness in pricing. A further advantage associated with the use of standardized computer components, as opposed to custom pieces, is that of performance.

The dollar-for-dollar performance advantage of many standardized components over similar custom components can be viewed as a beneficial consequence of the balance between the resources invested in each product and the efforts to optimize its function. Standardized components have higher sales volume and return potential than custom components, thereby generally allowing additional resources to be invested in their production. Standardized components also face broader competition regarding performance. Therefore, if sales are to be made at a given price point, the performance of the corresponding standardized component must excel.

In contrast, even when custom components are desired, it is often not economically feasible to optimize performance. The paramount concern is to meet the specific needs calling for the customization. This is particularly so when space conservation is the primary consideration. Although the number of smaller computers available for duty where space conservation is important has increased, they are typically very expensive. Also, these smaller custom computer systems often suffer in the areas of computing speed and system reliability relative to computers using less costly standardized components.

It should be noted, however, that additional factors affect the performance of existing space-saving computer systems. The compaction of layout in shrinking main board sizes results in component crowding and imparts additional design constraints which hinder design for optimal performance. Crowding can adversely affect the manner in which components are connected as well as result in significant heat dissipation problems. Further compromises are often made in shrinking computer sizes. To conserve space, smaller fans or fewer fans may be included in a design. Also, custom-made power supplies and data drives may be required in producing a compact system. As with main boards designed for small size, these units often lag in performance relative to their standardized counterparts.

The use of custom components introduces further difficulties when they break down. Supply issues can be such a difficulty as to make it more feasible to replace an entire machine so as not to lose its computing power for an extended time, rather than wait for repair components necessary to get the existing machine up and running. This difficulty is often compounded by an increased failure rate experienced with custom components.

All of these disadvantages aside, there exists a need for compact computer systems in the server industry. It is this very need which has justified acceptance of current compact systems despite their performance and thermodynamic disadvantages. Especially with the advent and rise of the Internet and World Wide Web, an increasing demand for more computers to be connected to serve as network hosts or servers has arisen.

The function of network serves may be carried out by more traditional "servers" in the form of powerful computers usually configured to perform specific functions. Another more recently developed model in providing network services is with grouped computers or "modules" linked, in part, through software such as the VNC software package available through Oracle, Inc., to form a "farm" or "puzzle" of computers working together. Computers set up in a farm or otherwise provided in a coordinated set will include their own processors, data drives and so-forth in order that each may accomplish a fraction of the work intended for the whole.

Farms, in particular, have several advantages over typical servers. One advantage is the combined speed of processors working together in a coordinated manner. Another advantage resides in the redundancy of a farm's structure. If any one module fails, it can be extracted or replaced with no ill effect other than the fractional loss of the farm's capacity. Put another way, failure of part the set of computers does not shut down the whole. In contrast, when any portion of a server fails, the whole system may go down. If the failure itself does not cause the loss, shutting down the computer for a necessary repair certainly will.

Irrespective of the type of network host that might be employed, it is clear that there is a growing need for compact, serviceable network resources. This has lead to an increasing need for space in which to house the network host units and a consolidation of spaces where they are located. Sites known as co-location sites where numerous networked computers find a home now exist. Space for the computers is typically rented at such sites. Rent calculations may be based on the overall space occupied, power consumption and bandwidth handled by the computers occupying the space. Because of the relationship between such factors, it will often be in favor of both a co-location site and computer service provider to maximize both the density and performance efficiency of the computers at a given site. By increasing the density at which computers may be packed into a given area, the service provider benefits since less space is required for a given number of computers; the co-location site benefits since the ultimate bandwidth available in association with the space available may be greatly increased.

Other less apparent benefits stem from conserving the space a host computer occupies. In many instances, it will be economically feasible to forestall the retirement of otherwise outdated host computers since the cost of the space they occupy is relatively lower, thereby justifying their continued service for a period of time. On the other hand, where it is preferred to only maintain the highest-end computers in service, the savings available by minimizing the size of such computers without hindering performance is quite clear.

There exists a need for computer systems adapted for realizing these many advantages.

Typically, at a site where numerous computers are connected to a network, the computers are provided stacked in racks arranged in repeating rows or cells. Access to the computers is necessary for servicing, upgrading hardware, loading software, attaching cables, switching power on and off, and so forth. The elimination of as much access space as is feasible can increase the density of computer systems that may be provided for a given square footage of area at a site. Moveable rack solutions can be used to decrease access space requirements. However, they have not gained wide acceptance. Consequently, there exists a need to eliminate extraneous access space while still maintaining the use of relatively inexpensive, standard (or more-or-less standard) racks.

A rack that is currently being widely used measures roughly 19 inches wide, 30 inches deep and 74 inches high. In at least one co-location site, these racks are lined up in rows of roughly 10–30 units with access doors on each side of a rack. Access aisles are provided on both sides of the rows. Many of the racks are filled with cumbersome computers mounted on sliders which are attached through mounting holes provided in the front and back of the rack. Regardless of the chassis design of the computers (or lack thereof where computers are merely built on open trays with their components uncovered) and how they are mounted to the racks, data devices included in the computer are accessed from the front. Main board I/O's, other I/O's, power cords and such items are typically accessed from the back. It is this latter design aspect which not only results in inefficiency in the amount of access space required, but also in the frequent inefficiencies associated with having to administer services to both sides of a computer. Consequently, there exists a need for computers useable in a network setting that are accessible and fully serviceable from a single side.

In order to significantly increase the density at which computers in a given space are provided, the only solution to date has been to shrink the computer's box. As such, there exists a need to increase the density at which computers may be provided in a given space by what means are possible while still having the ability to utilize standardized components. Aspects of the present invention including single-sided access help in this regard.

Additionally, there exists a need for improved cooling of computers, especially where large numbers are provided. This need is compounded by increased computer density. Features of the invention help meet this need as well. In certain situations, this need to maintain acceptable computer temperatures can compete with the need to maintain the environment in which the computers are housed at an acceptable temperature without exorbitant expenditures for environmental cooling. Certain features of the invention directed at cooling the computers help in this regard.

SUMMARY OF THE INVENTION

This invention is a system designed to maximize the density of computers that may be provided in a given space. Several features of the invention enable one to provide a higher density of computer systems at a site. Preferably, the computers are built from standardized or readily-available components, except for the chassis herein described.

One way in which the present invention conserves space and increases computer density is to eliminate the need for access to both the front and back of a computer. This is accomplished by an inventive chassis design in which ports for items requiring physical access are placed only at the front of the chassis. Items requiring physical access include, but are not limited to: various data drives or storage devices and physical input and output sockets. Preferably, the rear of a computer chassis made according to the invention is free of any such access ports. However, this "front access" feature of the present invention does not require that each and every physical attachment to a computer be located in front of the machine. Desirably, those which require physical access periodically or would significantly hinder forward removal of the machine from a rack in which it may be stacked are provided for at the front of the chassis. At least those features located on the main board which would normally be accessed from behind and accessible data drives are provided for in the front of the inventive chassis.

The above-described chassis configuration allows for effective placement of computer components in a back-to-back arrangement within a rack or other supporting structure. This back-to-back placement of computer components within a rack forms a highly desirable aspect of the invention. Such placement often doubles or further multiplies the density potential for rack computer systems, e.g., those in which the computers would otherwise be mounted one unit deep. The back-to-back mounting of computer chassis may also involve the back-to-back placement of full-function computers linked to one another or the back-to-back placement of a computer and a device such as a drive array serving the computer which it abuts.

Another aspect of the invention which aids in increasing the density at which computers may be provided is attained by placing the inventive chassis in a back-to-back fashion in a manner so that a space between the backs of the various chassis is present when the units are in a rack. Cooled or forced air may then be provided in this rectangular back space (and, if so desired, to the space between the sides of the chassis and side panels of some racks) to pass through a computer chassis and be vented through the front of the machine. Optimally, this back-to-front flow of cooling gas traveling through the computer is directed to particularly hot-running or temperature-sensitive components such as power supplies or CPU's. Various inlets, vents, fans, and baffles may be specially-configured or controlled to provide desired flow properties and optimize cooling and/or temperature stabilization. Ideally, forced air at ambient temperature or forced and/or cooled air as low as about 40° F. (5° C.) or lower is used. Air provided in the space between computers and or the rack which house them may come either from above through ductwork typically present in a building or below where advantage may be taken of the fact that heat rises.

The backspace and optional sidespace between the computers or rack sides may be used in another advantageous manner. Especially where maintaining a lower environmental temperature is a concern, a flow reversed from that described above will be advantageous. Such reversed flow may be accomplished by drawing ambient air by fans and/or a partial vacuum through the computer chassis past heat-generating components and venting it from the common space between the computers by a hood or plenum, vent or other means. Common ductwork may take the heated air out of the site. Alternately, it may be preferred that each hood independently exhausts air out of the site in which the computers are located. Providing front-to-back flow will cool computer components as well as help maintain lower ambient temperatures than possible with other high-density network computer solutions. As desired above, it is preferred that the flow of cooling gas is directed to or by hot-running or temperature sensitive components.

Providing cooling flow in either a back-to-front direction or a front-to-back direction as possible with the hardware and/or configuration of computers and racks as disclosed herein forms part of the present invention. Generally, this invention includes methods and also various hardware components either in isolation or in combination where they may work together to ultimately achieve the desired results.

BRIEF DESCRIPTION OF THE DRAWINGS

Each of the following figures diagrammatically illustrates aspects of the present invention. The illustrations provide examples of the invention described herein. It is contemplated that combinations of aspects of specific variations or combinations of the specific variations themselves are within the scope of this disclosure.

DETAILED DESCRIPTION

Figure 1:
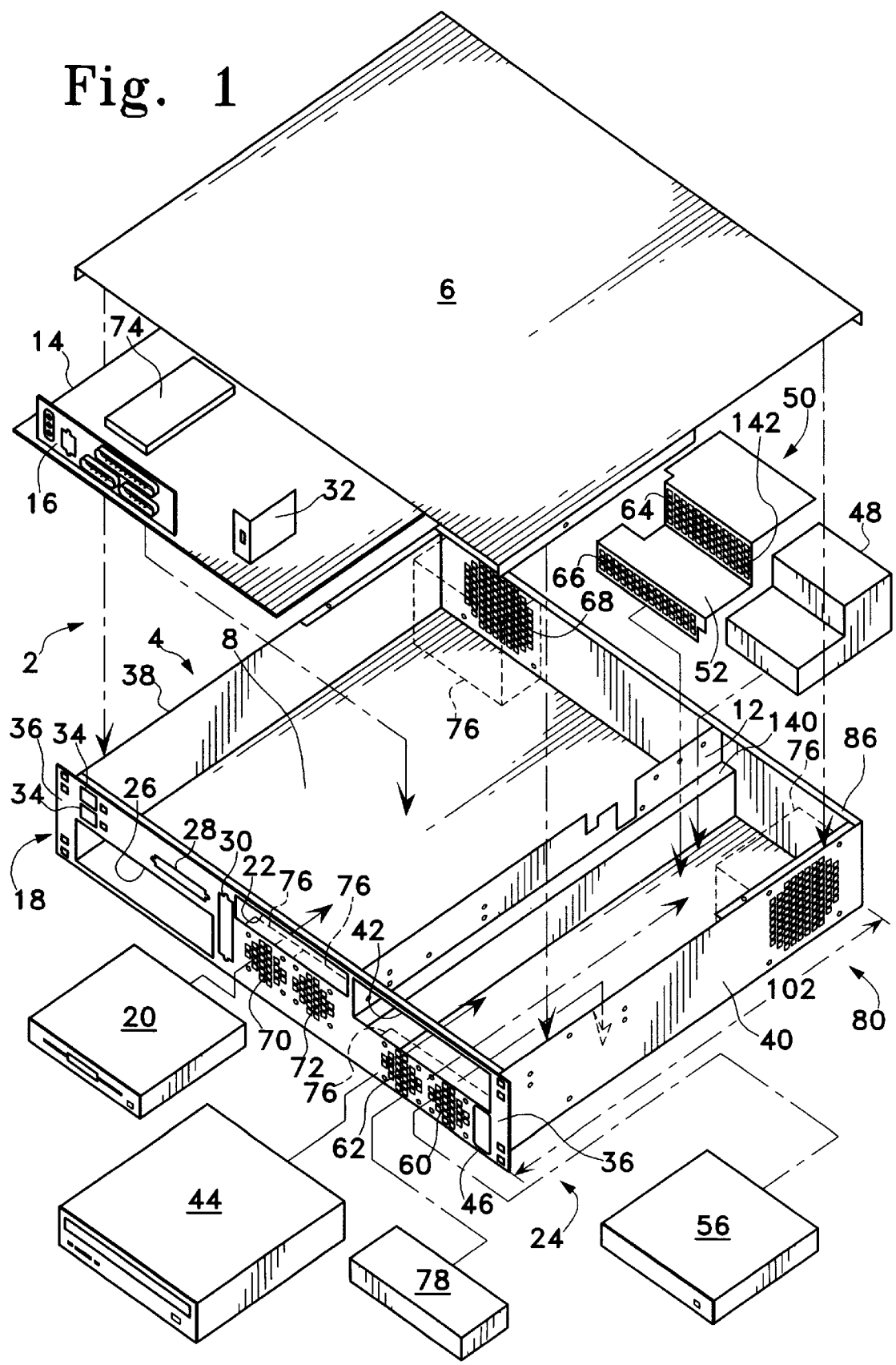
FIG. 1 shows a configuration of the inventive chassis as it may be built-up with certain components to form a computer.

FIG. 1 shows a configuration of the inventive chassis as it may be assembled with standard components. Although the use of standard components is preferred, of course, none of the components must be so. The chassis 2 will usually include a chassis body 4 and a chassis cover 6. A main board compartment 8, and a power supply compartment 10 separated by a baffle 12 are optionally provided. Preferably, the main board compartment 8 is sized to fit an ATX form factor main board 14. Preferred main boards include models N44BX, L44GX, 810, 810E and C440GX by Intel, Inc. Such main boards typically include an I/O shield 16. The chassis 2, is preferably made of zinc plated mild steel sheet metal, with the front panel 18 painted. Rivets, welds or other suitable fastening methods may be used to secure various components and hold the chassis body 4 in shape.

The main board compartment 8 is preferably of a height sufficient to include room for a 3.5 inch disk drive 20 above main board 14 in a port 22 in the front panel 18 of the front section 24 of the chassis. The variation shown in FIG. 1 is "2U" in height. Especially when using different CPU configurations, alternate heights as described below may be advantageous.

Whatever the configuration, a port 26 for the main board shield 16 will be provided in the front panel 18 of the chassis body 4. A port 28 in the front panel for an external SCSI drive (not shown) or other such device may also be provided. Another port 30 of such a size to fit numerous connectors (such as a parallel port connector) or a port for an Ethernet card (not shown) to fit in the main board 14 is also provided in the variation shown in FIG. 1. Further, ports 34 for switches are optionally provided.

The front panel 18 defining the various ports may be configured to attach to a rack by providing interface sections 36 extending from the sides 38, 40 of the chassis body 4. In-line with the power supply compartment 10, in the variation of FIG. 1, the front panel 18 also includes a port 42 capable of receiving a 5¼ inch device 44. A number of devices may be optionally used in this port. As diagrammatically pictured, a drive 44, such as a removable-medium drive (e.g., CD, DVD, ZIP, JAZZ, DAT, Smart Cards, Flash disk and Tape drives or others whether designed for a standard size desktop or network computer or of smaller size for a portable computer or the like) may variously be used in a hard-wired, hot-swappable or replaceable configuration. A hot-swappable hard drive or CD ROM may be preferred.

Common to all such drives is the need for access for the purpose of changing the data storage media or for pulling the device itself. The same is true for the connectors attachable to the shield 16 of the main board 14 discussed above and/or for connectors to accommodate USB/external SCSI or parallel port devices or other auxiliary data drives configured for plug-in use. In the variation shown in FIG. 1, optional port 46 accommodating a power cord fitting to a power supply 48 to be housed in the power supply compartment 10 is provided.

Preferably, the chassis 2 is configured so power cords such as those which would be connected at port 46 will be located at one side of the unit, while other cords, wires or the like for data transmission will be connected at the other side. In this way, two well-organized columns of connection members will be developed when a rack is filled with chassis 2 spanning the front of it.

Preferably, the power supply 48 for use in the assembled computer is made of high-quality standard components. In the configuration shown in FIG. 1, a customized power supply shield 50 may be provided with a step 142 from a lower region 52 to an upper region 54 in order to accept the larger 5¼ inch devices. Just as the power supply shield 50 may include a step 142 to provide clearance for desirable drives in the power supply compartment 10, the baffle 12 may include a step or jog 140. The jog 140 shown is provided as clearance for both the 5¼ inch port 42 and for certain desirable main boards 14 in the main board compartment 8 while maintaining a total frontal width narrow enough to fit in a typical rack having a 19 inch wide opening.

A hard drive 56 may be placed below any 5¼ inch device used. It is also possible to provide various brackets elsewhere within the chassis body 4 to mount additional hard drives as space permits. The placement of the hard drive 56 indicated is, however, optimal in view of the cooling features provided in this variant of the invention. While vents 58, 60 and 62 and fans 76 in front of the vents are provided foremost to generate a stream of air optionally in a direction as indicated to cool the power supply 48, the drive 56 is exposed to a beneficial stream of cooling air as well. Vents 64 and 66 in the power supply cover 50 allow the air to move through the same without significant impediment.

In a manner similar to that of the configuration of the power supply compartment 10 which is intended to pass cooling gas or air across the power supply, vents 68, 70 and 72 and fans 76 in front of the vents provided in the main board compartment 8 direct cooling air over or near the CPU(s) 74 of the main board 14. In the variant pictured, a diagonal flow of air may be achieved as indicated.

The cooling of the chassis compartments 8 and 10 may be provided by fans 76 which severally run continuously while the computer is on or alternatively there may be more selective control of at least some of the fans 76. For instance, where a thermal control unit 78 is included in the computer design, separate channels of the unit may be set to monitor the temperature of the chambers and turn on and off fans in each of the chassis compartment or the device itself to help maintain temperatures as constant as possible. Such a set-up can reduce thermal cycling issues that may arise due to differing power consumption and waste-heat generation of components (especially CPUs) depending on their usage. Also, the direction of air flow may be varied by switching the direction in which the fans 76 turn.

Figure 2A:
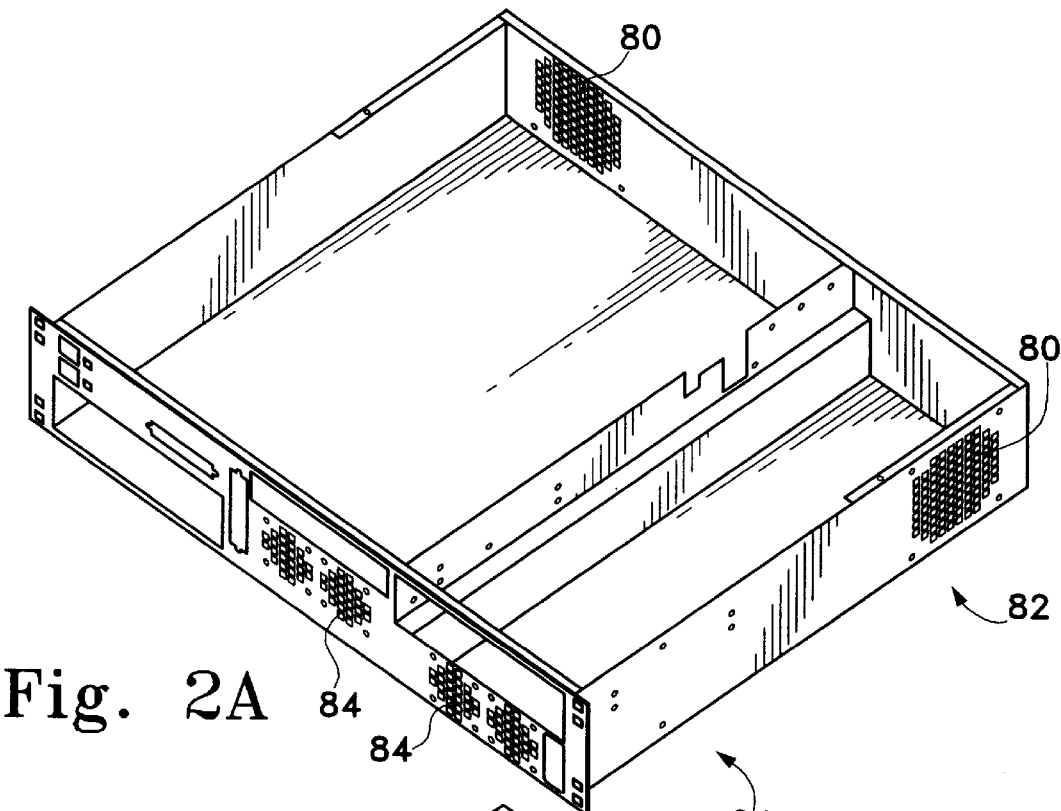
FIGS. 2A, 2B, 2C, 2D and 2E show configurations of the inventive chassis.

FIG. 2A shows the variation of the inventive chassis which is shown built-up in FIG. 1, as may any of the other chassis pictured and/or described. The chassis of FIGS. 2B, 2C, 2D and 2E include ports with generally identical functions as indicated by corresponding sizing, profile and/or numbering. The differences between the chassis are a matter of what ports are considered to be preferred for the computer configuration desired. All configurations, however, exhibit the common feature that each of their ports for all components requiring or designed for intermittent access by a user are on one side of the chassis. In the variant shown in FIG. 2C, no jog in the baffle 12 is required since no 5¼ inch device port is provided.

Figure 2B:
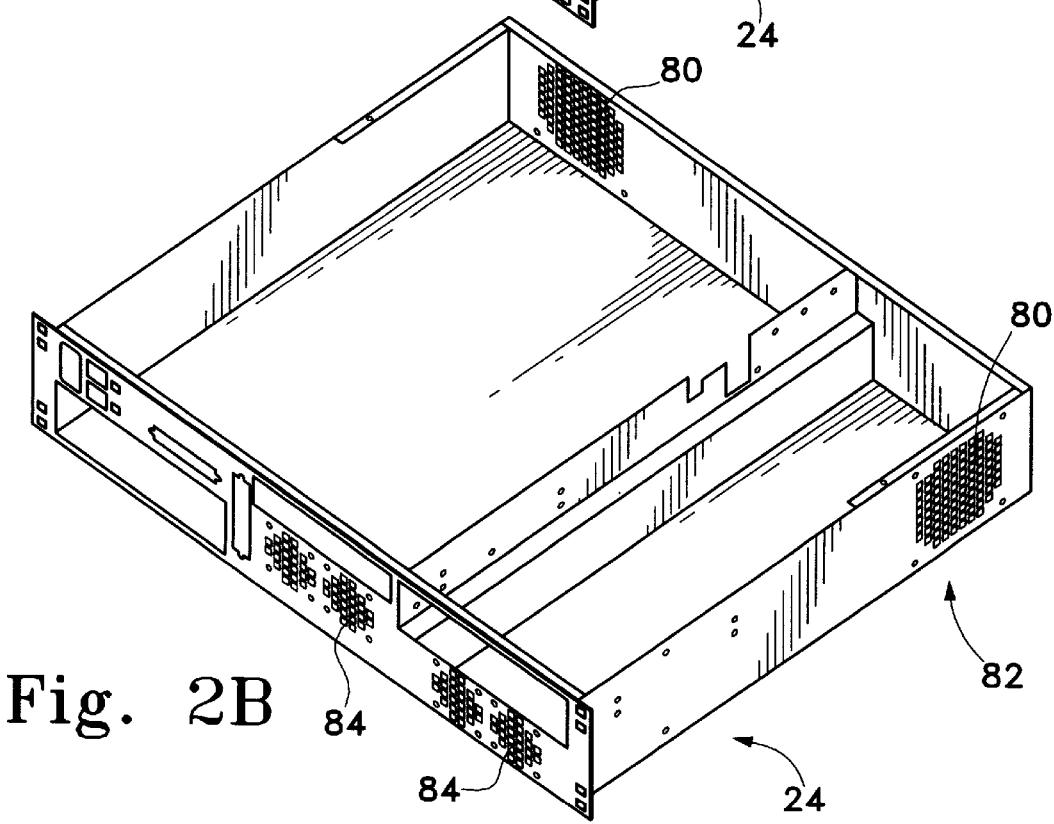
Figure 2C:
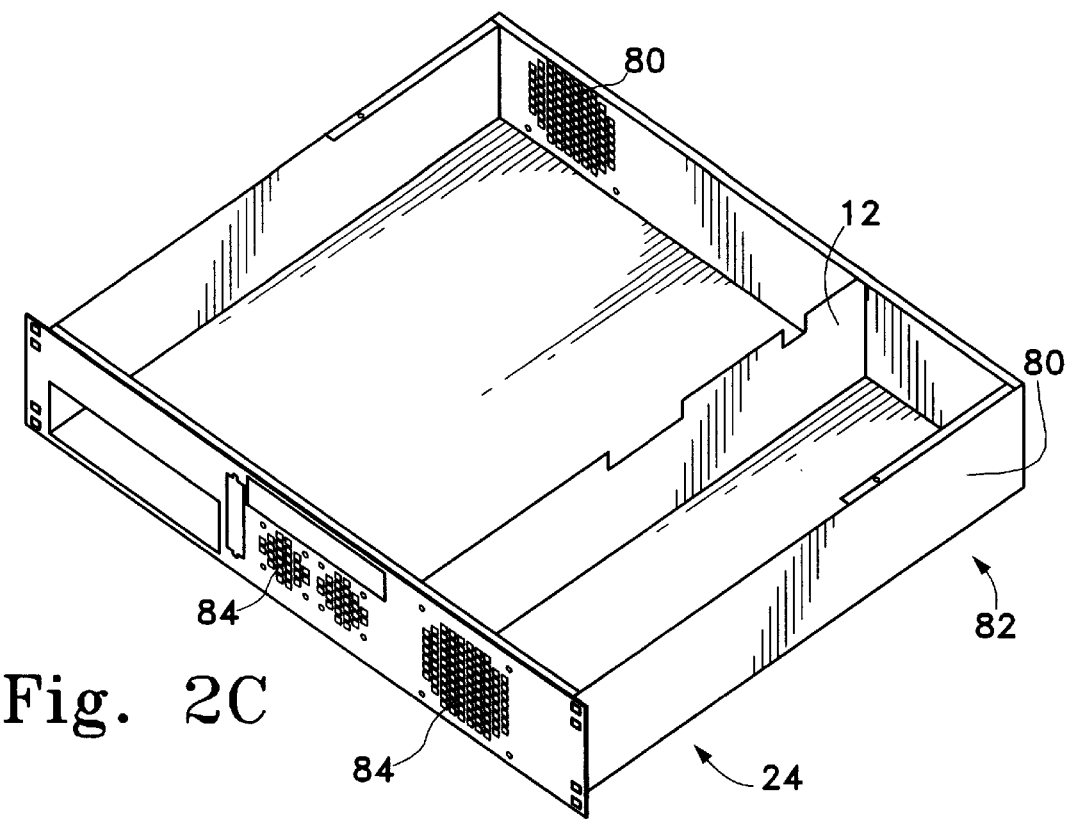
Figure 2D:
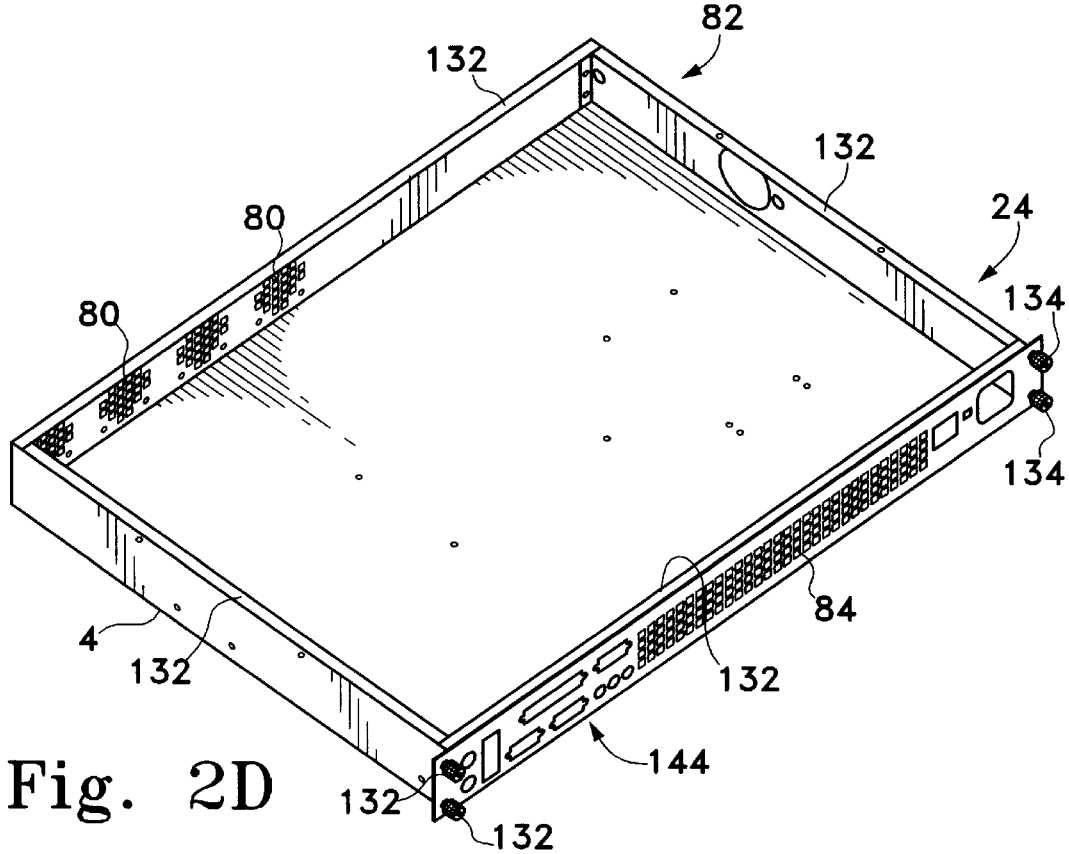

In the variant shown in FIG. 2D, no baffle is included at all. To account for the loss of such support as provided by a baffle 12 in the other variants of the invention, a top flange 132 is preferably provided around the entire periphery of the chassis body 4. Further, as shown in FIG. 2D, the chassis body 4 need not include any ports for internal data drives. As alluded to above, it is possible to use the chassis in combination with external data devices configured for intermittent connection. Dedicated ports in the face 18 may be provided for such accessibility. Alternately, optional ports 144 provided for a main board I/O's ports may suffice.

FIGS. 2D and 2F show a "1U" variant of the inventive chassis. Such a configuration may be used to efficiently house a 810X main board. The stacking of 1U chassis in a rack enables the provision of up to four times the number of computers as compared to others (such as Rack-Mount 02 systems available through Silicon Graphics, Inc.) that may be provided in a given rack. Therefore, up to 84 IU computers may be housed in a 74 inch high standard rack.

A 1U chassis will be particularly advantageous to use where additional CPU power is desired for a farm or set of computers in a rack since use of such a slim chassis will result in packing more processor power into less space in a rack. However, fewer peripherals may be used in such a slim design. Also, presently, typical two CPU main boards may not be used in a IU chassis. In view of such limitations in assembling a rack of computers, it will often be advantageous to employ computers built in chassis of varying heights. Still as long as a sufficient number of 1U chassis are employed in combination with taller units, it is possible to provide racks with upwards of 40 or 60 computers for a 74 inch high rack.

By virtue of each chassis being configured to accept a main board 14 in a horizontal orientation and the remaining layout of the chassis adapted to accept other components beside the same (whether on the opposite side of a baffle wall 12 or not), it is possible to maintain the low profiles displayed such as with 1U and 2U designs specifically described. This configuration is also useful for producing low profile computers of heights anywhere between about 1U and about 3U.

The approximate height of a 1U chassis is about 1¾ inches. Naturally, the various 2U, 3U, 4U and taller models have heights corresponding to multiples of the 1U height. As clearly known in the art, a 1U chassis unit is mountable between three mounting holes on a standard rack. Taller units span an increasing number of holes.

As with the other chassis in FIGS. 2A–2C, the variations shown in FIG. 2D may be mounted on the rack by its front flange members at interface section 36. Due to the height of the chassis, the number or width of vents 80 and 84 may be increased as shown to maximize the open cross-sectional area for cooling gas to pass through a chassis. Additional, but smaller, fans may also be employed. Also, it may be advantageous to use smaller data drives in such a chassis, e.g. drives made for laptop or portable computers, or to eliminate provision for internal drives and rely only on ports for external drives as described above.

Figure 4:
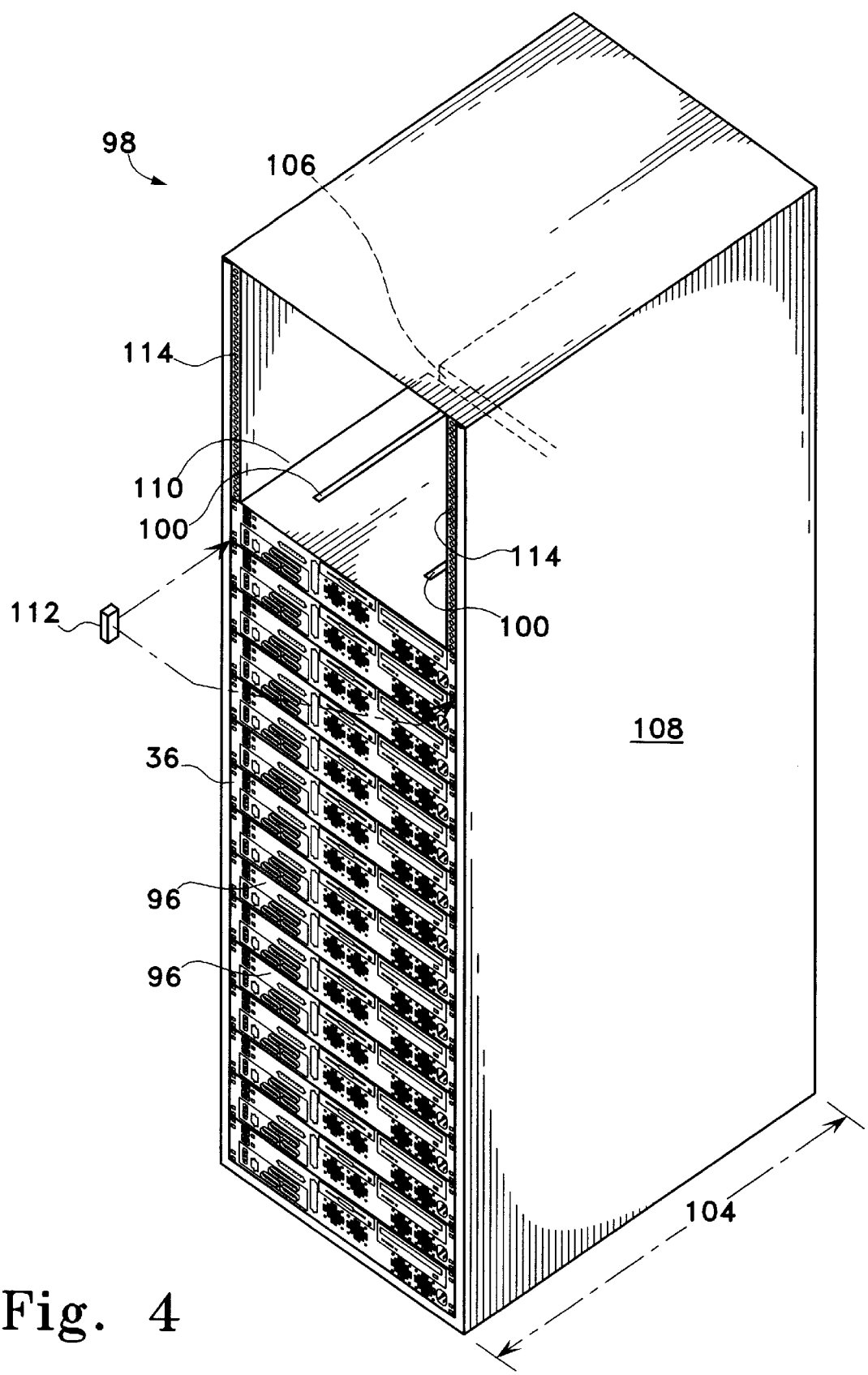
FIG. 4 shows an oblique view of a rack partially filled with computers according to the invention.

Especially with the unmodified flange-mount chassis designs shown in FIGS. 2A–2D, where longer chassis are desired for use in a back-to-back configuration in a standard rack, it will be preferred to mount the computers to racks using longer bolts (or other affixation means) and with spacers 112 between the interface section 36 and opposing rack portions 114 across from each on a rack as indicated in FIG. 4. As pictured in FIG. 2D, integrated bolts 134 of a style pressed in to the chassis body 4 so they will remain with the unit and serve as handles to remove the chassis may be generally preferable with any chasis for affixing the chassis 2 to the rack 98 along each side 114. Spacer 112 may be the height of only a single chassis, of the rack mounting portions 114 or somewhere in between. In this way, it will be possible to produce longer chassis and still maintain the advantageous backspace 106 as otherwise possible such as described below.

Figure 2E:
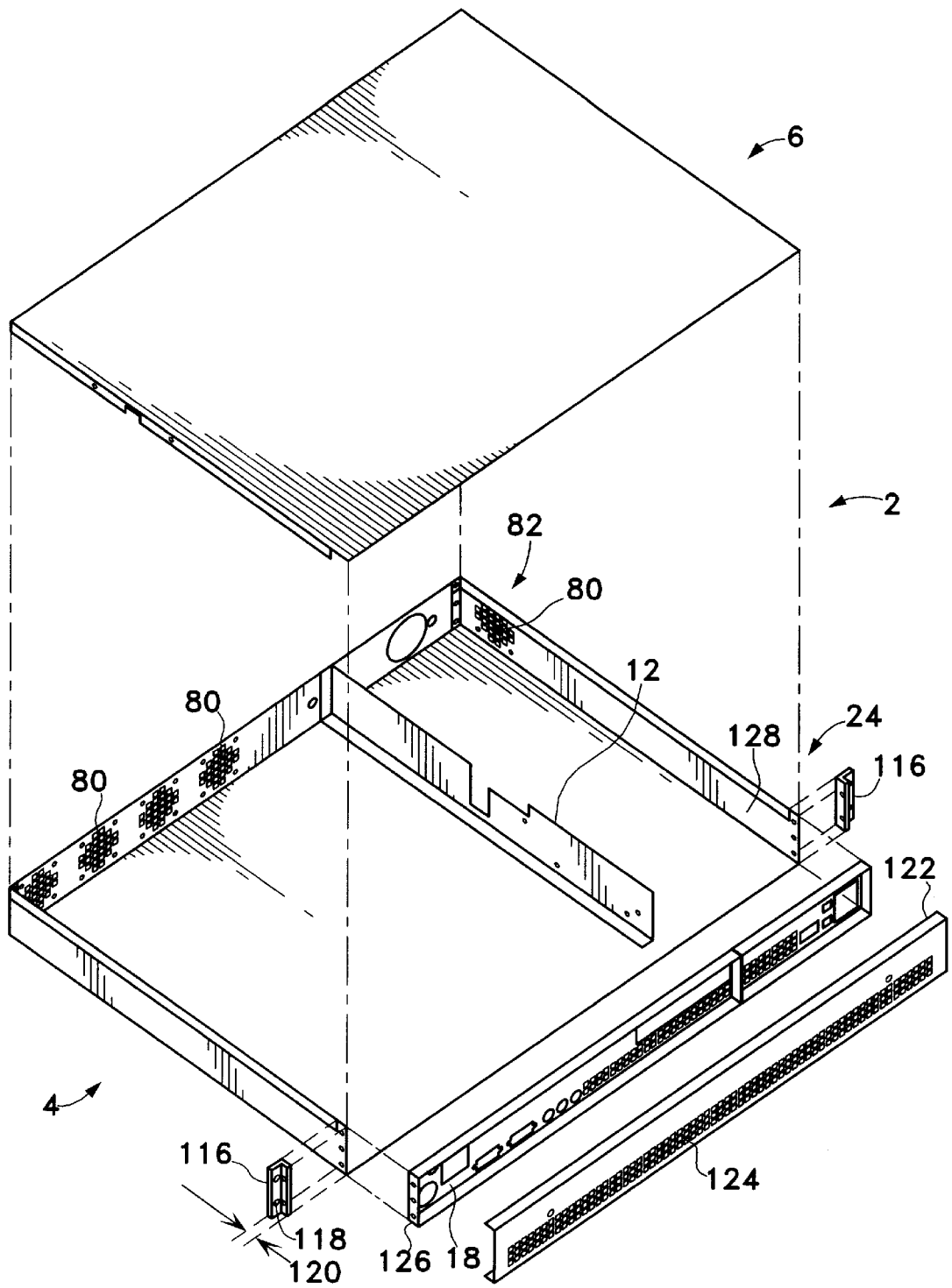

The goal of providing longer chassis for use with a standard rack can be accomplished with the inventive chassis in other manners. As shown in FIG. 2E, brackets 116 attachable to the chassis itself that may be set back or offset from the face 18 of the unit in order to provide a chassis position which is pushed forward from the norm. Here brackets 116 are provided with holes 118 with which to mount the chassis to the rack sides 114. Depending on the depth of offset 120 of each bracket 116, or how far back the brackets 116 are located on the chassis body 4, it is possible to advance the front of the chassis a significant amount out the front of the rack so as to be able to provide a lengthy chassis which may still be mounted back-to-back with other chassis (of similar or different configuration) as described herein.

Yet another manner to accomplish the same goal is to provide an integral flange or interface section 36 configured like that of the bracket 116 so it provides an area for attachment set back from the face 18 of the chassis. Such an interface section 36 will provide the desired forward offset 120 to enable back-to-back placement of longer chassis than otherwise possible in a standard rack without the use of spacers 112 or the like.

Another advantageous feature that may be utilized in the present invention to include a face plate 122 for use with the chassis. Such a face plate 122 as shown in FIG. 2E may be used with any variation of the invention. The face plate 122 will typically include ventilation holes 124 to allow cooling air or other gas to pass through. In a preferred variation, the ventilation holes span most of the face of the piece. Optimally, the face plate 122 is connected to the chassis by a hinged interface. However, any slip fit, friction fit or snap fit to the front of the chassis will suffice. At least one side of the face plate will be left open so that cables, wires and like connected to the front of a computer assembled according to the present invention can be routed out the open area(s) to connect to such components as required for the computer to serve in a network. Preferably, both sides are open to accommodate the dual wire/cable column configuration for power and data cables, respectively, as discussed above.

While any of the variations of the chassis described herein may make use of the face plate 122, only higher-end models will use a separate bezel 126. In this variation of the invention (and in like variations of differing height vent configuration, baffle configuration, etc.), the bezel 126, once connected, forms part of the chassis body 4. In the variation shown, one or more common fasteners attach each bracket 116 and the bezel 126 to the sides 128 of the chassis body 4.

An advantage of using such a bezel 126 is that it may be customized easily or exchanged for another which is more advantageous for a given computer to be built. In essence, the bezel 126 allows for increased design and marketing flexibility since changes in chassis 2 configuration can be made in a piecemeal fashion. This differs from those variations of the chassis which include an integrally-produced front panel 18.

Regardless of such variations as possible, a preferred commonality between all the configurations of the chassis 2 is the general placement of vents. While some differences are shown between the chassis shown in FIGS. 2A–2E, at least one set of vents 80 is provided in the rear section 82 of the chassis body 4 and another set 84 in the front section 24. Depending on the placement and selection of components with which to build a computer in the inventive chassis 2, the placement of the vents in the rear on the back panel 86 or side panels 38 or 40 may be varied. However, for those aspects of the invention in which venting and the flow of air through the chassis is relevant, some vents will be provided in the front 18 of the chassis 2. Even when not used with other aspects of the present invention, the air flow may travel from the rear section 82 to the front section 24. Alternately, it may travel in the other direction. In fact, direction of air flow may be set depending on the desired effect on the environment and/or condition(s) of the environment. It may even be switchable to account for changing environmental conditions such as variations in the temperature of the site housing the computers due to seasonal climate or the difference in environmental temperatures between day and night or other events.

The advantageous use of air flow through the entire chassis and across heat-generating components is still possible where only one compartment is provided within the chassis 2. While the baffle 12 is often advantageous for isolating compartments for placement of hot-running components and aiding the vents in directing air flow, its use is merely optional. Especially in instances where a removable power supply is provided in a port such as port 42 in the front of the chassis, the advantages of a two-compartment chassis design wanes.

Figure 3A:
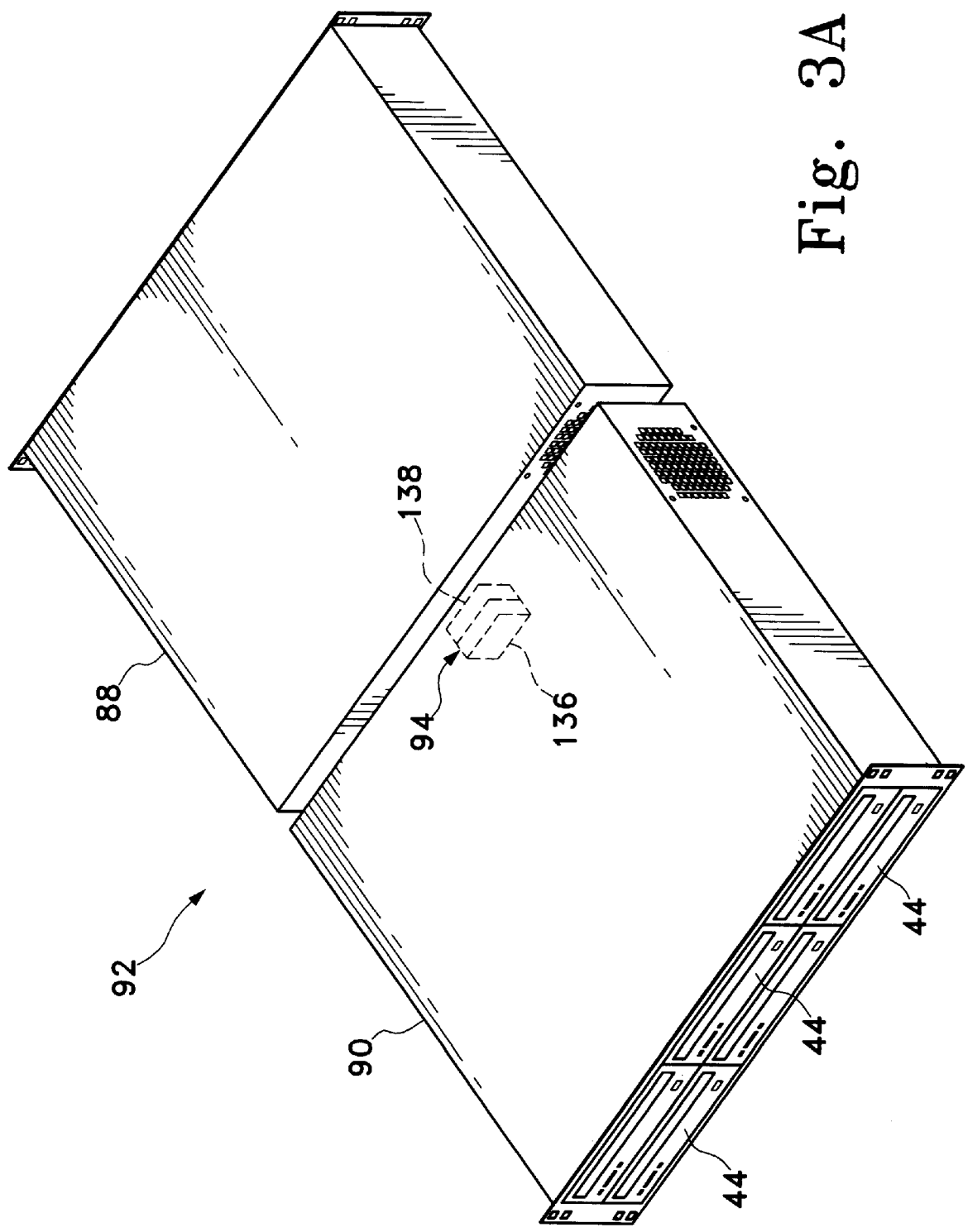
FIGS. 3A and 3B show back-to-back computer system configurations.

FIG. 3A shows an example of an arrangement in which use of a removable power supply would be particularly advantageous. In this variation of the invention, a computer module 88 is built in accordance with that shown and described in FIG. 3B utilizing a chassis with front access for components, except a redundant two-socket power module (not shown) is provided. Placed at the back of unit 88 is an "array" or "RAID" module 90 including a number of data drives 44. Together the modules 88 and 90 form a powerful system 92 optimized for space and accessibility.

In such a configuration, the computer module 88 need not include a hard drive. In the array module 90, any number or type of drive(s), including those discussed above may be provided in either hard-wired or swappable configurations. Drives which require accessibility when the modules 88 and 90 are mounted back-toback are accommodated by ports in the array 90 chassis on the outwardly-facing side. In this specialized variation of the invention, a port for a connector 94, such as a SCSI interface, is provided in the rear of each unit 88 and 90. Optimally, connector ports 136 and 138 will be at the bottom of each piece so units of differing height may still interface with one another.

Figure 3B:
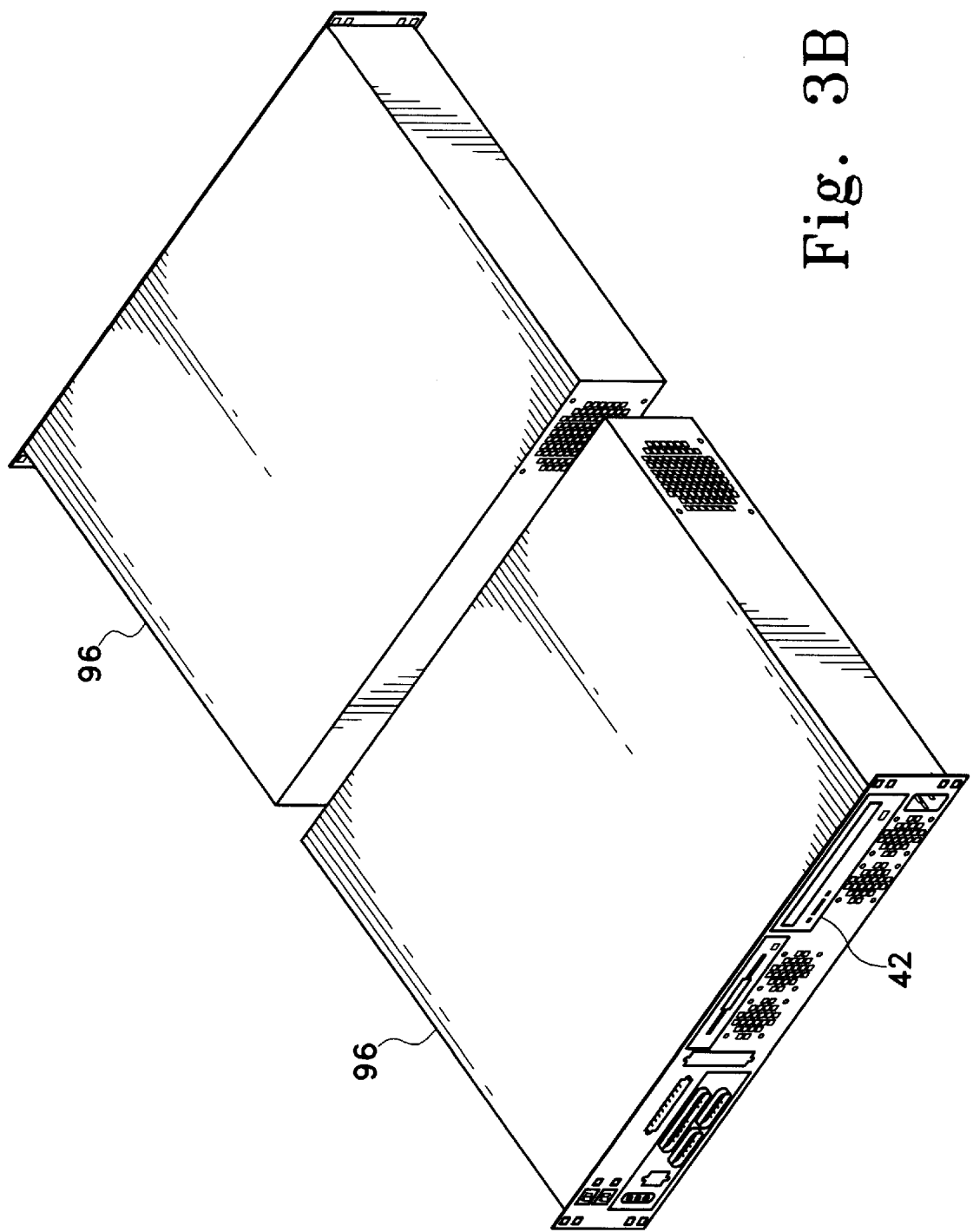

A more typical application of the inventive chassis is shown in FIG. 3B. Here, full computers 96 built with the chassis 2 are provided in a back-to-back configuration. Preferably they are hooked up in the manner of a farm. Generally, no connections will run between the units as with the computer system 92 discussed above. This is, however, possible. It will be advantageous particularly where power is shared over an interface 94 between computers 96 in FIG. 3A. This enables swapping out a removable power supply such as that which may be provided in port 42 while maintaining power to each computer 96.

It is preferred that back-to-back pairs of computers 96 (whether connected or not) are mounted in a standard rack 98 in one layer after another as shown in FIG. 4. They may be mounted to the rack on slides (not shown), by integral interface sections 36 ,brackets 116 as alternately described above or otherwise. When no slide is used, it is preferred to place strips of adhesive TEFLON tape 100 or the like on the surface of at least one computer under or above another. While the chassis 2 are sufficiently strong and the assembled units light enough to be self-supporting when bolted into a rack, the tape 100 takes up space to provide support and makes sliding a unit out from a rack for service more convenient.

The rack shown in FIG. 4 will hold up to 40 computers 96 built with the 2U inventive chassis. As alluded to above, this is because the use of the chassis in a back-to-back configuration permits the doubling of the number of computers that may be stored in a standard rack. Of course, when utilizing chassis according to the present invention of different heights, this ratio changes. To do this, (unless using spacers 112 or offset mounting brackets 116 or interface portions 36), regardless of the height of the chassis 2 the depth of the chassis 102 must be less than half the available depth 104 of the rack in order to stack computers two deep. Without the use of specialized mounting configurations, preferably the chassis depth 102 is less than 15 inches (38 cm) when configured for a 30 inch (76 cm) deep rack.

In a most preferred variation of the invention, the depth of the chassis 2 is even less. For use in a standard 30 inch deep rack, the chassis depth 102 is 13.5 to 14.5 inches deep (34 to 37 cm). This is so because when a sufficient number of computers are placed back-to-back in a rack as contemplated in the present invention, an advantageous optional back space 106 between about 1 to 6 inches, preferably about 1 to 3 inches is formed behind the computers. When side panels 108 are provided on the rack 98, the back space 106 is complemented by side space 110 between the sides of the computers 38, 40 and the rack side panels 108 to form an H-shaped space. The space behind the computers may, however, be cordoned off to leave only a rectangular volume if desired.

When back-connected units such as array modules 90 and computer modules 88 or 96 are used in combination in a rack 108, they are also preferably configured in this manner to define (preferably with other computers, of one height or another, as described in the present invention) such channels or spaces. The back-to-back connection between the units will not significantly hinder the functionality provided by the air space. However, it is highly undesirable to have the air space cluttered by other structure such as cables, cords and the like. This is why the front-access configurations of the inventive chassis are advantageously used in conjunction with providing an air space between computer modules within a rack 98 or other enclosure as might be used.

Figure 5:
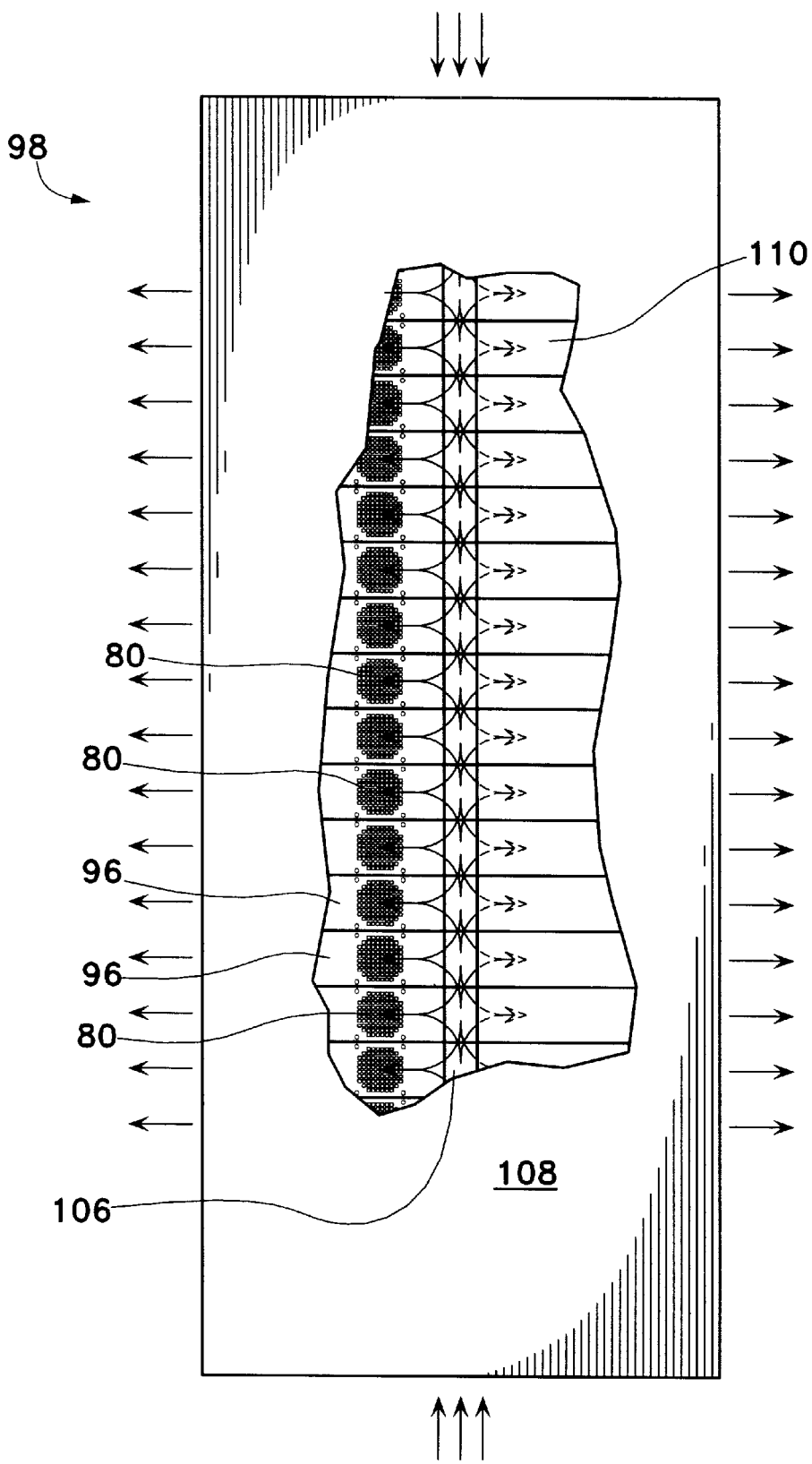
FIGS. 5 and 6 show partial cut-away side views of racks filled with computers according to the invention.

As mentioned above, the space provided between computer modules may be advantageously used in a number of ways. For instance, as illustrated in FIG. 5 a positive airflow as optionally indicated from above, below or in both directions, may be provided to the space. Providing a measure of gas pressure will tend to force air through vents 80 in the units defining the space as indicated. If enough pressure is provided, it would be possible, in principle, to provide computers without fans.

However, the primary intent in providing air under pressure to the back space 106 and/or side space 110 is to assist the fans or to provide a measure of redundancy so that if one or more fans fail that the air pressure maintains some level of flow within the computer chassis. Such a backup can provide a technician the time cushion needed before a system overheats (in order to take the computer off-line or out of the network or farm for repairs) before vital componentry is burnt up.

Even where forced air is not provided, the air mass may be cooled. By drawing cooled air through the individual computers past hot-running components, improved cooling will result. Most preferably, however, forced and cooled air, such as standard air conditioning (HVAC) is provided with a compounding of benefits resulting.

Another benefit of providing a controlled flow of air in the back space 106 and/or side space 110 to pass through the computers and be vented out the front as indicated in FIG. 5 is the opportunity to provide filtered air to the air intakes of the computers. This will control the accumulation of harmful dust in the machines. Additionally, lower power consumption costs may result for a site housing many computers utilizing the cooling features of the invention. Efficient application of cooled air to power-intensive components is possible with the advantages of this aspect of the present invention.

It is noted that the cooling features of the present invention discussed above should do still more than save energy and space to benefit the bottom line for the parties making use of them. It should also provide welcome relief for those who work at a co-location site that has fully-adopted the new form factor offered by the present invention since it will not be necessary to keep the entire environment at frigid levels in order to keep the computers present within running acceptably.

Figure 6:
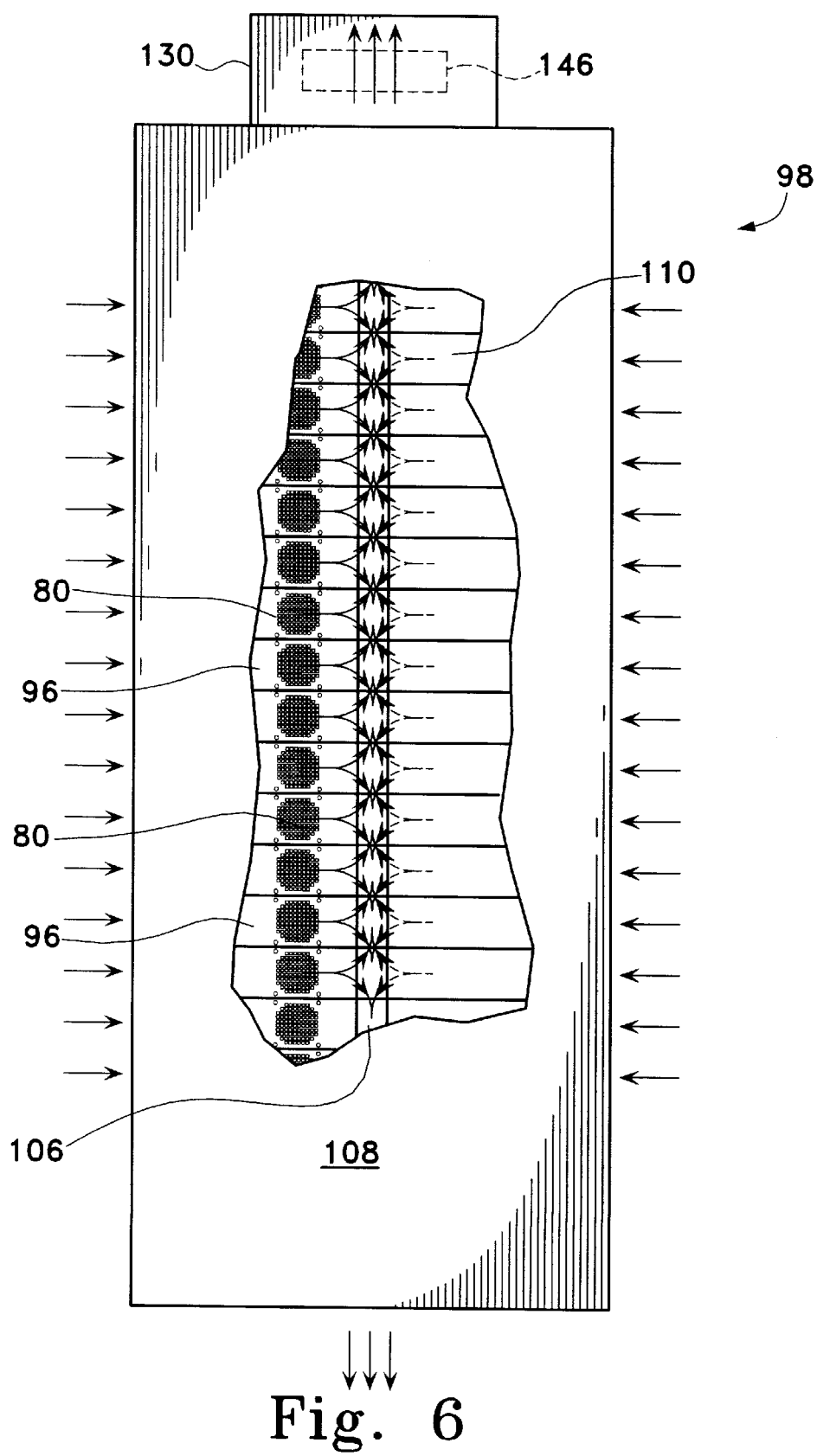

Sometimes, however, it will be preferable to reverse the airflow from the back-to-front airflow as variously shown in FIG. 5 to front-to-back airflow as variously shown in FIG. 6. As such, air travels from the environment, through the front of the computers, into the backspace 106 and/or sidespace 110 and out of the rack 98. A vent in the form of a hood enclosure or plenum 130 optionally including fan(s) 146 may be provided to exhaust air heated by components within the computer to the exterior of the site at which the computers are located via ductwork or independently. Irrespective of its structure, in this variation of the invention, the vent 130 may be passive or utilize a partial vacuum generated by a fan or by some other means. Preferably, the air is exhausted from inside the rack 98 in an upward direction to take advantage of the buoyancy exhibited by heated air. It is, however, possible to vent the air from below or from above and below simultaneously.

When higher velocities of air are reached within the channel formed between the components placed back-to-back within the rack 98, a venture effect will increasingly assist in drawing air through the machines from the environment in which they are housed. This effect may be best accomplished by top and bottom venting of the rack.

Reasons for providing sets of computers utilizing front-to-back airflow into and out of the common space 106 and/or 110 include, but are not limited to, maintaining an acceptable overall temperature of the environment in which the computers are housed, controlling environmental cooling or air-conditioning costs and providing a self-contained unit that may be individually vented so as to avoid contribution to an overall heating problem of a facility or exacerbating heating problems of nearby, less-robust systems by blowing hot air in their direction. To aid in providing a discrete system which will not contribute to overall heating problems at a site, further isolation of the system may be accomplished by providing insulation at, along or within the sides of the rack 98 and/or at any optional door(s) provided.

As similarly possible with the present invention when set up for back-to-front cooling flow, with front-to-back cooling flow the effect of loss of fan(s) in a computer may be minimized. Provision of partial vacuum within backspace 106 and/or sidespace 110 will insure a continued draw of air into a computer if fans fail, thereby providing a measure of redundancy; it will also generally assist the fans in providing air flow through the chassis 2 when everything is working properly.

Regardless of which flow direction is chosen (or if there is switching between the flow directions), advantageous flow across heat-generating components which must be cooled is possible with the present invention. Generating directional flow of cooling gas through the computer chassis from one side to another according to the present invention avoids recirculation or cavitation of already heated air that hinders cooling as typically occurs with other computers.

Further details as to the use or other aspects of the system described herein may be drawn from the background that is intended to form part of the present invention. It is noted that this invention has been described and specific examples or variations of the invention have been portrayed. The use of those specific examples is not intended to limit the invention in any way. Additionally, to the extent that there are variations of the invention which are within the spirit of the disclosure and are equivalent to features found in the claims, it is the intent that the claims cover those variations as well. All equivalents are considered to be within the scope of the claimed invention, even those which may not have been set forth herein merely for the sake of relative brevity. Also, the various aspects of the invention described herein, in any manner, may be modified and/or used in combination with such other aspects also described to be part of the invention either explicitly, implicitly or inherently in order to form variations considered to be part of the invention.

We claim:

1. A set of computers comprising:
    at least one rack; and
    at least two computers, each computer having a front section and a back section located opposite each other in each of said computers, two of said computers being placed in a back-to-back configuration of said rack;
    wherein said computers and said at least one rack cooperate to define a space between said computers and to direct air flowing into said space such that a quantity of air sufficient to constitute a cooling flow for said computers either (1) enters the space and exits out through the computers or (2) enters through the computers into the space and exits out of the space.

2. The set of claim 1, wherein said space between said computers directs air flowing into said space to flow from said space into the back section of said computers and out of the front section of said computers.

3. The set of claim 2, wherein said rack includes side panels and said space is in the form of an H-shaped volume.

4. The set of claim 1, wherein the front section of at least one computer extends beyond an attachment area of said rack.

5. The set of claim 4 further comprising a spacer between a mounting flange of a computer and said attachment area of said rack to extend said at least one computer beyond the attachment area of said rack.

6. The set of claim 4 further comprising a bracket having an offset from the front section of the computer to extend said at least one computer beyond the attachment area of said rack.

7. The set of claim 4 said front section comprises an offset flange to extend said at least one computer beyond the attachment area of said rack.

8. The set of claim 1, wherein said computers are configured with at least one vent provided at the back section of a computer and at least one vent at the front section of the computer.

9. The set of claim 8, wherein at least one vent provided in the back section of a computer is provided along a rear panel.

10. The set of claim 8, wherein at least one vent provided in the back section of a computer is provided along a side panel.

11. The set of claim 8, wherein at least some of said computers include a baffle separating a compartment for a main board from a compartment for a power supply.

12. The set of claim 8, wherein at least some of said computers include at least one fan.

13. The set of claim 12, further comprising a thermal monitor adapted to increase or to decrease air flow within a computer to reduce the effects of thermal cycling on components.

14. The set of claim 13 wherein said at least two computers are connected as a portion of a network.

15. The set of claim 1, wherein said computers are configured so components requiring intermittent physical access are provided in the front of the computers.

16. The set of claim 1, wherein said computers are configured so components requiring intermittent physical access are accessible through the front section of the computers.

17. The set of claim 1, wherein said space between said computers directs air flowing into said space from said computers out of said space.

18. A method of cooling computers that are mounted back-to-back in at least one rack to form a computer system having a channel for air between said back-to-back computers comprising:
    passing a quantity of air sufficient to cool said computers from said channel into, through, and out of each computer.

19. The method of claim 18, wherein the step of passing the quantity of air from said channel into, through, and out of each computer comprises providing fans in said computers, said fans adapted to draw air from said channel through said computers.

20. The method of claim 18, wherein the step of passing the quantity of air from said channel into, through and out of each computer comprises providing forced air to said channel.

21. The method of claim 18, wherein the step of passing the quantity of air from said channel into, through, and out of each computer comprises providing cooled air to said channel.

22. The method of claim 18, wherein the step of passing the quantity of air from said channel into, through, and out of each computer comprises providing air conditioned air to said channel.

23. A method of cooling computers situated in an air environment that are back-to-back in at least one rack and having a channel for air between said back-to-back computers comprising:
    drawing a quantity of air sufficient to cool the computers from said environment through each computer into said channel and out said at least one rack.

24. The method of claim 23, wherein the step of drawing the quantity of air sufficient to cool the computers from said environment through each computer and into said channel comprises providing fans in said computers adapted to draw air from said environment through said computers.

25. The method of claim 23, wherein the step of drawing the quantity of air sufficient to cool the computers from said environment through each computer and into said channel comprises providing a partial vacuum to said channel to contribute to gas flow through said computers.

26. The method of claim 23, wherein the step of drawing the quantity of air sufficient to cool the computers from said environment through each computer and into said channel comprises providing a partial vacuum to said channel to provide air flow through said computers.

27. The method of claim 23, further comprising the step of providing a vent or hood adapted to exhaust air flow from said channel.

28. The method of claim 23 further comprising the step of providing an insulated rack.

29. The method of claim 23 further comprising the step of providing said computers placed in the back-to-back relationship in said at least one rack to define the channel for air between the computers.

30. A method of cooling computers situated in an air environment that are back-to-back in at least one rack and having a channel for air between said back-to-back computer comprising:
    passing a quantity of air sufficient to cool the computers through each computer without recirculation of the air, wherein the quantity of air either (1) enters the space and flows out through the computers or (2) flows into the computers and exits out of the space.

31. The method of claim 30, wherein the step of passing the quantity of air sufficient to cool the computers through each computer without recirculation of air comprises passing air from said channel into, through, and out of each computer.

32. The method of claim 30, wherein the step of passing the quantity of air sufficient to cool the computers through each computer without recirculation of the air comprises drawing air from said environment through each computer into said channel and out of the rack.

33. The method of claim 30, further comprising:
    selecting a direction to pass air through the computer based on the temperature of said environment.

34. The method of claim 33, wherein the step of passing the quantity of air sufficient to cool the computers through each computer without recirculation of the air comprises passing air from said channel into, through, and out of each computer only when the temperature of said environment is below a selected temperature.

35. The method of claim 33, wherein the step of passing the quantity of air sufficient to cool the computers through each computer without recirculation of the air comprises drawing air from said environment through each computer into said channel and out of the rack only when the temperature of said environment is above a selected temperature.

36. The method of claim 33, further comprising:
switching said direction based on a change in the temperature of said environment.

37. The method of claim 30 further comprising the step of providing said computers placed in the back-to-back relationship in said at least one rack to define the channel for air between the computers.

38. A computer comprising:
a main board having an I/O shield mounted thereon; and
a chassis having a height between about 1U and 3U and providing ports on a single side of said chassis for receiving said I/O shield and all components requiring intermittent access provided for said computer.

39. The computer of claim 38, wherein said all components requiring intermittent access are selected from a group of data input devices consisting of: removable power supplies; removable drives, removable medium drives and plugs for external drives or devices.

40. A computer system comprising: at least one computer module and at least one array module, each having a front and a back opposite the front, said computer modules each including a main board and a power supply, said array modules each including multiple data storage devices, said computer module connected back-to-back to said array modules.

41. The system of claim 40, wherein the front of each module is adapted to interface with a rack.

42. The system of claim 41 installed in a rack.

43. The system of claim 42 wherein said at least one computer module, said at least one array module, and said rack define a channel for air.

44. A computer comprising: a thermal control unit and a chassis having a front section and an opposing back section and defining a main board compartment and a power supply compartment, at least one fan in each compartment, said thermal control unit configured to turn on and off said at least one fan in each compartment to help maintain a constant temperature in each compartment of the computer and to move air through the chassis either from the front section to the back section or from the back section to the front section.

45. The computer of claim 44, wherein said thermal control unit is configured to selectably run at least one said fan in one direction or another and thereby selectably to move air through the chassis either from the front section to the back section or from the back section to the front section.

46. A set of computers comprising: at least one rack and at least two computers, each computer having a front section and a back section, two of said computers being placed in a back-to-back configuration in said rack, wherein said computers are configured so components requiring intermittent physical access are provided in the front of the computers and wherein a spacer is provided between a mounting flange of a computer and an attachment area of said rack.

47. A set of computers comprising: at least one rack and at least two computers, each computer having a front section and a back section, two of said computers being placed in a back-to-back configuration in said rack, wherein said computers are configured a.) so components requiring intermittent physical access are provided in the front of the computers, and b.) wherein at least one of the computers is affixed to the rack with an offset flange that advances the front section of the computer beyond an attachment area of said rack.

* * * * *